TEMPERATURE STABILIZED TRANSISTOR AMPLIFIER

Original Filed June 12, 1956

2 Sheets-Sheet 1

INVENTOR:
JAMES W. STANTON,
BY Robert J. Steinmeyer
HIS ATTORNEY.

TEMPERATURE STABILIZED TRANSISTOR AMPLIFIER

Original Filed June 12, 1956 2 Sheets-Sheet 2

INVENTOR:
JAMES W. STANTON
BY Robert J. Steinmeyer
HIS ATTORNEY.

United States Patent Office 3,009,113

Patented Nov. 14, 1961

3,009,113

TEMPERATURE STABILIZED TRANSISTOR AMPLIFIER

James W. Stanton, Broomall, Pa., assignor to General Electric Company, a corporation of New York Continuation of application Ser. No. 590,925, June 12, 1956. This application Apr. 1, 1960, Ser. No. 19,422
7 Claims. (Cl. 330—19)

The present invention relates to semiconductor amplifiers and has as a particular object thereof, the provision of an improved direct current semiconductor amplifier. This application is a continuation of application Serial No. 590,925, filed June 12, 1956, and now abandoned.

Several rather serious problems have restricted the use of semiconductor devices in direct current amplifiers. These problems arise from two principal sources; those arising with respect to semiconductor interchangeability and those arising from ambient temperature influences upon the properties of the semiconductor devices. In the more critical applications, transistor semiconductor devices of the same type have not usually been interchangeable without selection. In general, since their characteristics are not precisely reproduceable, variations in amplification and in operating point of the amplifier are caused by transistor substitution.

The effects of ambient temperature upon transistors are also serious drawbacks to their use in sensitive direct current amplifiers. Most of the transistors' parameters are subject to change with temperature: the current gain (*a* or *b*), the voltage drop at the emitter junction $V_{eb}$, the base ($r_b$), emitter ($r_e$) and collector resistance ($r_c$), as well as the collector saturation current ($I_{co}$). The current gain (*a*) in junction transistors of the rate grown or diffused junction process is relatively insensitive to temperature change, frequently varying less than 1% in a typical temperature range of from 20° to 60° C. The emitter junction voltage drop decreases at approximately 2.4 millivolts per degree for germanium, producing a large disturbance in low impedance circuits. The base and collector resistance may vary as much as two to one in typical transistors while the emitter resistance may vary 15% in the above temperature range. The collector saturation current ($I_{co}$) is an exponential function of the ambient temperature, increasing perhaps 10 times within the indicated ambient temperature ranges. As with the other factors, the temperature effect upon collector saturation current differs from transistor to transistor. Transistor devices of germanium are somewhat less satisfactory than silicon devices in this respect.

In previous temperature compensated semiconductor amplifiers, the effect of temperature on these parameters does not seem to have been fully appreciated, and attempts have been made to compensate the amplifier by measures which took into account solely the change in $I_{co}$ current with ambient temperature. Likewise, attempts of a somewhat less sophisticated nature have been made, employing means for stabilizing the output current of the amplifier without precise determination of the causes of the change in output current. In general, both of these methods have two serious disadvantages. The actual change in output current, does not fit a smooth, easily generated correction curve, because of the wide dissimilarity in temperature dependence of the factors causing the ultimate disturbance in output current, and the measures resorted to have not been able to stabilize both the operating point and amplifier gain.

Accordingly, it is an object of the present invention to provide a semiconductor direct current amplifier which is relatively insensitive to substitution of the semiconductor devices employed.

It is a further object of the present invention to provide a semiconductor direct current amplifier which is relatively insensitive to changes in ambient temperature.

It is another object of the present invention to provide a transistor direct current amplifier whose amplification and operating point are stable with respect to ambient temperature.

These and other objects are achieved in one embodiment of the present invention in a direct current amplifier adapted to be operated as essentially a current amplifier. The amplifier employs two transistors connected in common emitter configuration and directly coupled to form two cascaded amplification stages. The first stage is adapted to be connected to an input circuit of high resistance relative to the input impedance of the first transistor stage. The emitter electrode of the first transistor is coupled to the common grounded connection through a low resistance path. The collector and base electrode of the first transistor are interconnected by a resistance having a value substantially less than the collector resistance of the transistor and yet substantially greater than the base resistance of the transistor. The second stage employs a series resistance coupled to the emitter electrode whose value is large enough relative to the base and emitter resistance to provide the principal portion of the second stage input impedance. These two last recited resistances are proportioned so as to make the input impedance of the second stage high with respect to the output impedance of the first stage. The load resistance of the second stage is chosen to be small relative to the collector resistance of the second transistor, divided by the base input current amplification (*b*). When the amplifier is so arranged and so proportioned, its parameters, with the principal exception of the collector saturation current, are found to be substantially independent of ambient temperature and of transistor substitution.

In accordance with a further aspect of the present invention, a temperature dependent current generator, comprising a source of direct potential and a reversely biased transistor, is connected to a tap on the collector-base connected resistance of the first transistor stage to compensate the operating point of the amplifier against changes in collector saturation current. Appropriate energization of the transistor by connection of resistances of suitable value in its base and emitter leads causes it to generate a current which is nearly a pure function of the collector saturation current. This last measure stabilizes the operating point of the amplifier to a high degree without adverse effect upon the high frequency response of the amplifier.

The features of the invention which are believed to be novel are set forth with particularity in the appended claims. The invention itself, however, both as to its organization and method of operation, together with further objects and advantages thereof may best be understood by reference to the following description when taken in connection with the following drawings, wherein:

Figure 4A:
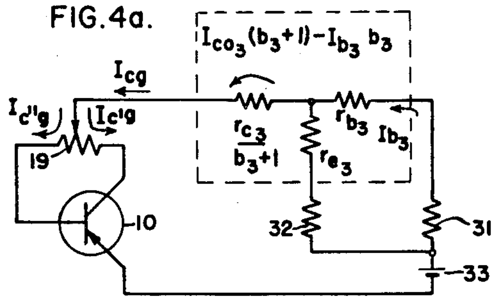
Figure 4B:
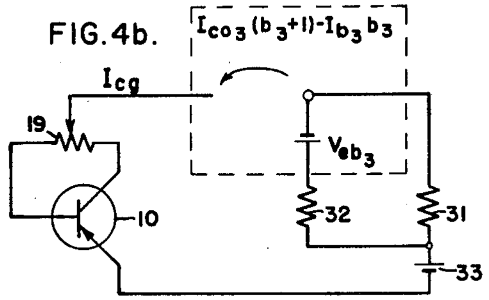
Figure 5:
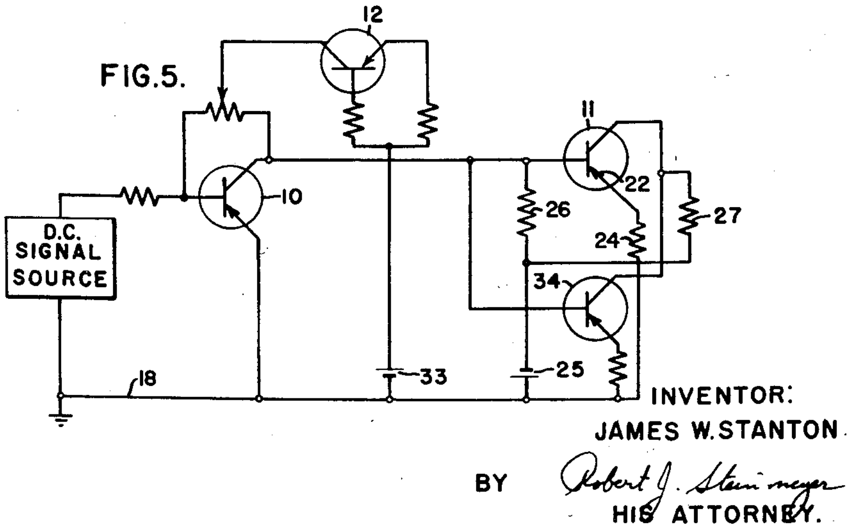

FIGURES 4*a* and 4*b* illustrate in respectively complete and simplified equivalent circuit form the current generator; and FIGURE 5 is an illustration of a second embodiment of the present invention.

Figure 1:
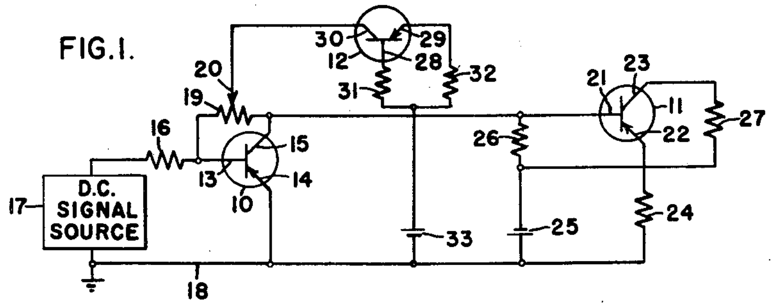
FIGURE 1 illustrates schematically a first embodiment of the invention.

FIGURE 1 illustrates a direct current amplifier built in accordance with the teaching of the present invention. The amplifier is a two stage amplifier, and employs three PNP transistors, transistor 10 for amplification in the first stage, transistor 11 for amplification in the second stage, and transistor 12 serving as a temperature dependent current generator. Transistor 10 is provided with a base electrode 13, an emitter electrode 14 and a collector electrode 15, all connected to operate in common emitter configuration. The base electrode 13 is connected through a resistance 16 to one terminal of signal source 17. Emitter electrode 14 is connected to grounded bus 18, to which the other signal source terminal is connected. A resistance 19 having an adjustable tap 20 has its end terminals connected respectively to the base electrode 13 and the collector electrode 15.

Transistor 11 having a base electrode 21, an emitter electrode 22 and a collector electrode 23 is connected in common emitter configuration. The base electrode 21 of transistor 11 is connected to the collector electrode 15 of transistor 10. The emitter electrode 22 is connected through a resistance 24 to the grounded bus 18.

Energizing potentials for the transistor 10 and 11 are provided by a direct current source 25 having its positive terminal connected to the grounded bus 18. A resistance 26 couples the collector electrode of the transistor 10 and the base electrode of transistor 11 to the negative terminal of the source 25. The collector electrode 23 of transistor 11 is connected through a load resistance 27 to the negative terminal of the source 25. The resistance 27 serves as the load across which the amplifier output is developed.

The transistor 12, which serves as the temperature dependent current generator, has a base electrode 28, an emitter electrode 29 and a collector electrode 30. The base electrode 28 and emitter electrode 29 are each connected through resistances, 31 and 32 respectively, to the positive terminal of a source of direct current potentials 33. The negative terminal of source 33 is connected to the grounded bus 18. The collector electrode 30 is connected to the tap 20 on resistance 19.

The transistor amplifier illustrated in FIGURE 1 provides two base-input emitter-common amplification stages. The signal current to be amplified is developed in the signal source 17 and applied to the transistor input electrodes in a path including the resistance 16 connected to the base electrode 13. An amplified version of the signal applied between the base electrode 13 and emitter electrode 14 of the first transistor is obtained at the collector electrode 15, being developed across the input impedance of the second stage. The input circuit of the second stage comprises the series combination of the input diode of transistor 11, consisting of the base electrode 21 and emitter electrode 22, and the resistance 24 which is connected between the emitter electrode 22 and ground. The signal is again amplified by transistor 11, and the final amplified version is developed across the load resistance 27, coupled to the collector electrode 23.

A constructive embodiment of the amplifier illustrated in FIGURE 1 employing 2N43 transistors, utilized the following circuit parameters, which are given by way of illustrative example, and should not be construed as limiting the invention thereto:

| | | |
|---|---|---|
| Resistance **16** | megohm | 1 |
| Resistance **19** | ohms | 60,000 |
| Resistance **24** | do | 1,000 |
| Resistance **26** | do | 22,000 |
| Resistance **27** | do | 150 |
| Resistance **31** | do | 47,000 |
| Resistance **32** | do | 47,000 |
| Source **25** | volts | 10 |
| Source **33** | do | 20 |

Such constructive embodiment of the amplifier gave a current amplification of 100, delivering up to 5 milliamperes of signal current to the 150 ohm load. Values of equivalent input drift current of less than one microampere have been frequently obtained with similar embodiments for a range of temperatures of from 20° C. to 50° C. with 2N43 type transistors. When experimental "rate grown" germanium transistors have been employed, an equivalent input drift current of less than 0.2 microampere, has been obtained. In general, at 50° C. the gain is reduced less than 0.5%, while at 60° C. the gain is reduced only approximately 2.5% with germanium transistors. Above 50° C., however, the use of silicon type transistors which may be operated to 150° C. with approximately the same drift currents is usually indicated.

Figure 2:
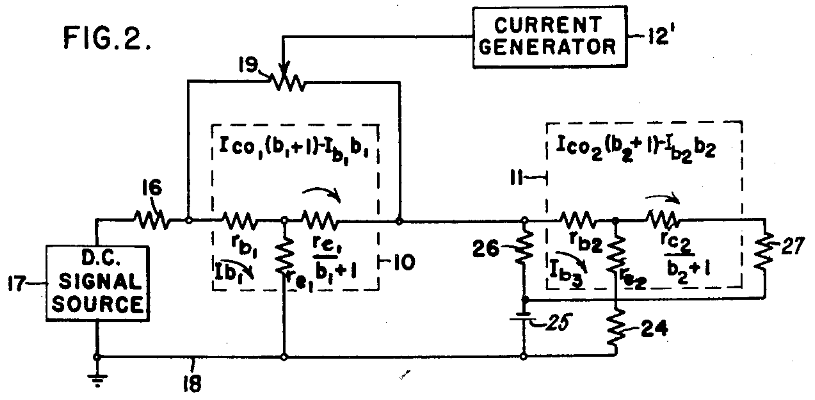
FIGURE 2 illustrates the embodiment shown in FIGURE 1 in complete equivalent circuit form.
Figure 3:
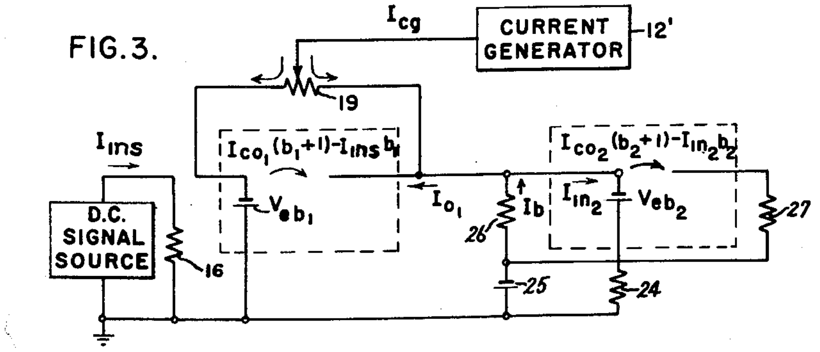
FIGURE 3 illustrates the embodiment shown in FIGURE 1 in simplified equivalent circuit form.

The amplifier illustrated schematically in FIGURE 1 is shown in equivalent circuit diagram in FIGURES 2 and 3. The equivalent circuit diagram of FIGURE 2 shows the transistors in a T equivalent representation with an equivalent current generator to represent the active properties of the transistors. The temperature sensitive current generator 12' comprises transistor 12, resistances 31 and 32, and source 33, and is shown as a simplified block. The equivalent circuit illustrates in detail the large number of transistor parameters which must be considered in describing transistor action and which enter into a determination of amplifier gain and operating point. As indicated earlier, all of these parameters are temperature sensitive. In accordance with the present invention, the effects of the majority of these parameters are eliminated by use of the configuration and mode of selection of circuit values above typified, thus permitting the amplifier to be treated as shown in the greatly simplified equivalent circuit diagram of FIGURE 3. In particular, it may be noted that all the resistive parametets of the transistor have been omitted. However, to more accurately represent the voltage drop at the emitter junction ($V_{eb}$) which is in part a function of input current and in part a function of temperature, the new representation of the transistor illustrates equivalent voltage sources $V_{eb1}$ and $V_{eb2}$ in respectively the first and second transistor emitter branches.

The manner in which the effects of all temperature sensitive parameters are eliminated or greatly reduced may now be considered.

Consideration of the equivalent circuit of FIGURE 2 indicates that the input impedance ($R_{in2}$) of the second stage is a function of the base resistance ($r_{b2}$), emitter resistance ($r_{e2}$), the base input current gain ($b_2$), and the resistance 24. Precise analysis of the equivalent circuit of FIGURE 3 shows the relation to be:

$$R_{in2}=r_{b2}+(b_2+1)(r_{e2}+R_{24}) \qquad (1)$$

When $R_{24}$ is chosen to be much greater than $r_{e2}$, and to be much greater than $r_{b2}/(b_2+1)$: then $$R_{in2}\doteq R_{24}(b_2+1) \qquad (2)$$

an approximation. Assuming typical values; of $r_b=300$ ohms, $r_e=30$ ohms, $b=105$; and choosing $R_{24}=1000$ ohms, expression (2) approximates expression (1) with an error of only 3%, thus illustrating that the input impedance of the second stage is substantially independent of $r_e$ and $r_b$. Accordingly, temperature effects upon these parameters, or substitution of transistors having different $r_e$'s and $r_b$'s make negligible change in this area of consideration.

The drift current ($I_{s2}$) in the output of the second amplifier, arising from collector saturation current ($I_{co2}$) may be expressed as follows:

$$I_{s2}=\frac{(R_{24}+r_{e2})+(R_{o1}+r_{b2})I_{co2}}{(R_{24}+r_{e2})+\frac{(R_{o1}+r_{b2})}{b_2+1}} \qquad (3)$$

where $R_{01}$ is the output resistance of the first amplifier stage. This expression is based upon the complete equivalent circuit shown in FIGURE 2. If, however, $R_{24}$ has been chosen to be much greater than $r_{e2}$, as suggested above, the expression simplifies to:

$$I_{s2} \doteq \frac{R_{24}+(R_{o1}+r_{b2})}{R_{24}+\frac{R_{o1}+r_{b2}}{b_2+1}} \cdot I_{co2} \quad (4)$$

When one chooses $R_{24}$ to be large with respect to $$\frac{R_{o1}+r_{b2}}{b_2+1}$$

then the expression (4) simplifies to:

$$I_{s2} \doteq \frac{R_{24}+(R_{o1}+r_{b2})}{R_{24}} \cdot I_{co2} \quad (5)$$

The fraction multiplying $I_{co2}$ may be reduced to nearly unity, if the output impedance of the first stage is of low valve relative to $R_{24}$, and also relative to the base resistance of the second stage. Expression (5) further indicates that the drift current ($I_{s2}$) arising from collector saturation current ($I_{co2}$) is now substantially unaffected by the current gain ($b_2$) of the transistor employed.

The choice of a small load resistance ($R_{27}$) and a small emitter resistance ($R_{24}$) relative to $r_c/(b_2+1)$ makes the amplifier substantially insensitive of temperature effects or transistor substitution with regard to the collector resistance ($r_c$) of the output transistor. Assuming a collector resistance of 5 megohms and a current gain ($b$) of 105, we find that $R_{27}$ and $R_{24}$, assuming values of 1000 ohms each, are still less than 4% of the collector resistance. In consequence, the collector resistance is so large as to have negligible effects upon the circuit, and may be treated as infinite. Accordingly, by selection of the values suggested, variations in collector leakage resistance ($r_c$) produce a minimum effect upon the circuit.

In selecting $R_{24}$, several considerations are involved. As indicated above, a large $R_{24}$ relative to $r_{e2}$ and $r_{b2}/(b_2+1)$ stabilizes the input impedance by eliminating the effect of variations in $r_{e2}$ and $r_{b2}$ thereon, and a small $R_{24}$ relative to $r_{c2}/(r_{b2}+1)$ minimizes the effect of changes in $r_{c2}$ upon the output circuit. As discussed subsequently, $R_{24}$ which enters into the relation defining the input impedance of stage two, should be of a value to permit the input impedance of stage two to be large with respect to the output impedance of the first stage. A further consideration, also not previously noted is that the increase in stability resulting from enlarging the value for $R_{24}$ occasions a decrease in gain of the stage. The first three considerations, while acting in opposite directions to the last, are not in serious conflict with the last, since there is a large middle region where all considerations are substantially reconciled. Such a compromise value is the illustrative 1000 ohm value for resistance 24 here employed.

Having made the indicated selections of values for $R_{24}$ and $R_{27}$, $r_{b2}$, $r_{e2}$ and $r_{c2}$ may now be generally neglected. FIGURE 3 graphically shows the simplification achieved in the equivalent circuit representation. It should be noted however, that the input junction voltage drop ($V_{eb2}$) has been introduced into the equivalent circuit representation for the first time. This voltage drop might be said to form a portion of $r_{e2}$, which has been omitted. It is treated as a temperature sensitive voltage source, whose voltage decreases approximately 2.4 millivolts per degree centigrade. In the illustration of FIGURE 3, two temperature sensitive parameters, are still indicated in the second stage, whose compensation has not been effected; the input junction voltage drop ($V_{eb2}$) noted above, and the transistor current gain ($b_2$). The compensation of these factors may be taken up after we consider the properties of the preliminary amplification stage.

The first amplification stage is shown in a precise equivalent circuit diagram in FIGURE 2. By proper proportioning of the associated circuit parameters, the circuit may be treated as equivalent to the circuit shown in FIGURE 3.

In accordance with the invention, the input resistance $R_{16}$ is made large with respect to the input impedance of transitor 10:

$$R_{16} \gg r_{e1}(b_1+1)+r_{b1} \quad (6)$$

where $r_{e1}$, $b_1$, and $r_{b1}$ are the emitter resistance, the base input current gain, and the base resistance respectively of transistor 10. By this measure, the amount of current fed from the source 17 is made substantially independent of small variations in the input impedance of the first transistor. Likewise, the high impedance prevents any substantial diversion of feedback current flowing through resistance 19 into the source. This permits one to consider the input resistance as being directly connected to the common or grounding bus 18. A typical value for $R_{16}$ is 1 megohm.

The resistance 19 is chosen small with respect to the collector resistance ($r_{c1}$) of the first transistor. Assuming $R_{16}$ to be high, the output impedance ($R_{o1}$) of the first amplifier stage is the following function of the collector resistance ($r_{c1}$) and other parameters:

$$R_{o1} = \frac{(R_{19}+r_{b1})(r_{c1})}{(R_{19}+r_{b1}+r_{c1})(b_1+1)} \cdot + r_{e1} \quad (7)$$

If one chooses $R_{19}$ to be considerably less than $r_{c1}$, and assuming $r_{b1}$ to be negligible with respect to $r_{c1}$, then expression (7) simplifies as follows:

$$R_{o1} \doteq \frac{R_{19}+r_{b1}}{b_1+1} \cdot + r_{e1} \quad (8)$$

indicating that the collector resistance $r_{c1}$, may well be omitted from consideration as indicated in FIGURE 3.

If one chooses $R_{19}$ to be greater than $r_{b1}$, and greater than $(b+1)(r_{e1})$ then expression (8) may be simplified to:

$$R_{o1} \doteq \frac{R_{19}}{b_1+1} \quad (9)$$

indicating that none of the resistive parameters of the first transistor need be considered as entering into the output resistance of the first amplifier stage.

As indicated with respect to the second stage, the first stage upon proper selection of resistances 16 and 19 may be treated as if the resistive parameters of the transistors are of no effect upon the circuit, if one excludes the emitter-base voltage drop ($V_{eb}$) which forms a component of the emitter resistance ($r_{e1}$). The equivalent circuit diagram in FIGURE 3 then approximates the actual operation of the first stage. Since the input resistances of the junction transistors here used approximate 200 ohms, use of a resistance 16 in excess of 10,000 ohms is indicated. When an input circuit resistance of 1 megohm is employed, as here suggested, the simplified equivalent circuit is in error less than 1%. When one employs a source of high internal impedance, the indicated resistance 16 may be omitted or reduced in size, so long as the requirements indicated for the total source impedance satisfy the requirements indicated for resistance 16. The maximum value of resistance 16 is, of course, chosen to avoid too great a power loss.

Resistance 19 is chosen as a compromise between linearity of operation and stage gain. If one assumes a transistor of high quality, the collector resistance may exceed 10 megohms, while the base resistance $r_{b1}$ is approximately 200 ohms, and the emitter resistance $r_{e1}$ approximately 20 ohms. Theoretically, a choice of the geometric mean value of 140,000 ohms, would permit neglecting the resistive parameters, incurring an error of less than 1%. With the transistors of the type employed in the indicated embodiment, a value of 60,000 ohms was employed for resistance 19 assuming an average collector resistance of 5 megohms.

In making this selection of resistance parameters, the input impedance of the second stage is made high with respect to the output impedance of the first stage. In one constructive embodiment, the output resistance ($R_{o1}$) of the first stage was approximately 1500 ohms, while the input resistance ($R_{in2}$) of the second stage was approximately 100,000 ohms. A ratio of this magnitude tends to make the voltage applied to the second stage substantially independent of transistor substitution or temperature effects in the first stage.

Resistance 26 serves as a path for bias current going from source 25 to the collector electrode 15 of transistor 10 and to the base electrode 21 of transistor 11. In order that the bias current fed through this resistance be relatively constant and to prevent loading of the amplifier circuit, the resistance 26 is preferably at least 10 times as large as the output impedance ($R_{o1}$) of the first stage. The value of resistance 26 should probably not be much larger than ten times $R_{o1}$ to avoid loss of power. The requirement for resistance 26 may be stated as follows:

$$R_{26} \gg R_{o1}; \doteq 10\frac{R_{19}}{b_1+1} \quad (10)$$

The quiscent output current $I_o'$ is then:

$$I_o' = \frac{b_2}{\frac{(b_1+1)(b_2+1)}{R_{19}/R_{24}}+1} \cdot \frac{E_{25}}{R_{26}} \quad (11)$$

Assuming the numeral 1 in the denominator to be negligible, the expression simplifies to:

$$I_o' \doteq \frac{a_2 R_{19} E_{25}}{(b_1+1) R_{24} R_{26}} \doteq \frac{R_{19} E_{25}}{(b_1+1) R_{24} R_{26}} \quad (12)$$

Assuming that $R_{19}=60,000$ ohms, $R_{24}=1000$ ohms, $R_{26}=22,000$ ohms, $E_{25}=20$ volts and $b_1=42$; $I_o'$ becomes approximately 1¼ milliamperes, which is a typical operating point. One may select a higher or lower operating point so long as one does not exceed the power capabilities of the transistors employed, and so long as a linear region of operation is selected. As a practical matter, lower operating points are preferred since lower drifts accompany such operation.

The circuit shown in FIGURE 3 indicates generally that the effects of changes in resistive parameters are substantially compensated, leaving yet to be compensated the base-emitter voltage drops ($V_{eb1}$ and $V_{eb2}$), the current gains ($b_1$ and $b_2$), and the collector saturation currents ($I_{co1}$ and $I_{co2}$) of the transistors.

If we now consider the circuit of FIGURE 3, the following expression describes the effect of $V_{eb1}$ and $V_{eb2}$ upon the output current of the first stage and input current of the second stage:

$$R_{o1}I_{o1}+V_{eb1}=R_{in2}I_{in2}+V_{eb2} \quad (13)$$

Assuming, as we may, that $V_{eb1}$, and $V_{eb2}$ are of nearly the same magnitude for transistors of the same material, and also that the changes in $V_{eb1}$ and $V_{eb2}$ with temperature are very nearly equal, expression (10) simplifies to:

$$R_{o1}I_{o1} \doteq R_{in2}I_{in2} \quad (14)$$

Thus, it may be seen that the effects of the two-emitter-base voltages cancel out.

The amplifier output current $I_o$ at zero signal is substantially insensitive to changes in current gain in transistor 11. This is true whether the changes are attributable to temperature or to transistor substitution. This may be demonstrated by the following mathematical considerations:

$$I_{o1}+I_{in2}=I_b \quad (15)$$

where $I_b$ is the bias current supplied by source 25 through resistance 26. Rewriting expression (14):

$$I_{o1}=\frac{R_{in2}}{R_{o1}} \cdot I_{in2} \quad (14')$$

and substituting for $I_{o1}$ in expression 15, and solving for $I_{in2}$:

$$I_{in2}=\frac{I_b}{\frac{R_{in2}}{R_{o1}}+1} \quad (16)$$

Now $R_{in2}$ and $R_{o1}$ are defined by expressions 2 and 9, respectively. Substituting these values into expression 16:

$$I_{in2}=\frac{I_b}{\frac{R_{24}(b_2+1)(b_1+1)}{R_{19}}+1} \quad (17)$$

The amplifier output current $I_o$ is as follows:

$$I_o=b_2 I_{in2}=\frac{b_2 I_b}{\frac{R_{24}(b_2+1)(b_1+1)}{R_{19}}+1} \quad (18)$$

It should be noted that:

$$\frac{R_{24}(b_2+1)(b_1+1)}{R_{19}} \gg 1 \quad (19)$$

when $R_{24}$ and $R_{19}$ are properly selected (as above described) with respect to the current gains of the transistors employed. In one constructive example; where $b_1=42$, $b_2=105$, $R_{16}=1000$ ohms, $R_{24}=60,000$ ohms; the factor is 74 times as large as one. Hence, if we neglect 1 and simplify we find:

$$I_o \doteq \frac{R_{19} b_2 I_b}{R_{24}(b_2+1)(b_1+1)} \quad (20)$$

which may be rewritten:

$$I_0 \doteq \frac{R_{19} a_2 I_b}{R_{24}(b_1+1)} \quad (20')$$

It may now be noted that the "$a$" of a junction transistor is relatively insensitive to temperature in comparison to the "$b$" of the same transistor, due to the near unity value of "$a$," whose difference from unity is a factor in the definition $$\left(\frac{a}{1-a}\right) \text{ of}$$

Hence, by use of the circuit values and mode of connection illustrated, the variation in current gain ($a_2$) of the second transistor from temperature and transistor substitution is in large measure eliminated.

The effect of collector saturation current ($I_{co2}$) of the second transistor upon output current ($I_o$) and the effect of the current gain $b_1$ upon the output current ($I_o$), are offset, though not precisely neutralized by the circuit employed. The effect of collector saturation current, which forms a portion of the output current, with increasing ambient temperature is to occasion a like increase in output current. The effect of increased temperature upon $b$ is to increase it (in the usual range of temperatures and usual materials). Reference to expression 20′, shows that these effects are compensating.

The discussion of $b_1$ and $b_2$ has so far been with respect to operating point or output current ($I_o$) stabilization. The circuit also provides gain stabilization. The gain of the equivalent circuit shown in FIGURE 3, may be determined by relating the output signal current ($I_{os}$) to the input signal current ($I_{ins}$):

$$I_{os}=\frac{b_1 b_2 I_{ins}}{\frac{(b_1+1)(b_2+1)R_{24}}{R_{19}}+1} \quad (21)$$

The amplifier gain (A) becomes:

$$A=\frac{I_{os}}{I_{ins}} \doteq \frac{b_1 b_2 R_{19}}{(b_1+1)(b_2+1)R_{24}} \doteq a_1 a_2 \frac{R_{19}}{R_{24}} \quad (22)$$

assuming that the numeral 1 in the denominator may be neglected. As observed before, the "$a$" of junction transistors contrasted to the "$b$" is relatively constant with respect to temperature, indicating that the gain of the amplifier, which has now been reduced to a function of the "*a*'s" of the transistors is highly stable indeed. Experimental values show the gain to be constant to less than 0.5% over a temperature range of 20° C. to 50° C. and constant to less than 3% change over a range of from 20° C. to 60° C.

Ambient temperature effects on almost all of the transistor parameters have now been compensated. Only the effect on collector saturation current ($I_{co}$), is in large measure uncompensated. Having isolated this factor, it can now be readily compensated in accordance with the invention by employing a current generator, whose temperature dependence follows the same law as that of the collector saturation current of the amplifier's transistors. Such a current generator is shown in each of the figures. In FIGURES 4*a* and 4*b*, it is shown in equivalent circuit diagram.

The current generator is connected to a tap on resistance 19, which is coupled between the base and collector electrodes of transistor 10. By adjustment of the tap, the amount of compensation current ($I_{cg}$), fed into the input of stage one is controlled. The compensation current not going into the input of stage one goes into input of the second stage, where it has a greatly reduced effect of opposite polarity. In order to provide adequate compensation, the current generator 12' is provided with a capacity of from two to four times the saturation current $I_{co3}$ of the current generator transistor. Under normal conditions the tap is near the center of $R_{19}$.

The illustrated mode of connection of the current generator 12' to the input of the first stage has many advantages over connection to a resistance shunting the input electrodes. The illustrated connection avoids the loading effect and consequent signal loss of such a resistance upon the input of the first stage, especially at times when large amounts of compensation current are required. It further permits a current generator of more easily realized high internal impedance to be employed since the load resistance is now of a relatively low value. It also eliminates the temperature dependent drift current that the emitter base voltage ($V_{eb1}$) produces when the base-emitter electrodes are shunted.

The current generator 12' is arranged, in accordance with the present invention, to generate a compensation current which is substantially a pure logarithmic function of temperature, and in large measure independent of the other parameters of the transistor 12. This is achieved by making resistance 31 large to minimize the effect of the emitter resistance $r_{e3}$ and the emitter-base voltage $V_{eb3}$. Likewise, $R_{32}$ is chosen large with respect to the base resistance $r_{b3}$ to prevent its having an appreciable effect upon the operation of the current generator. The circuit of the current generator may then be represented as shown in FIGURE 4*b*. Typically, both $R_{31}$ and $R_{32}$ may be of 47,000 ohms. The source $V_3$ may be of 10 volts. The current generator produces a current $I_{cg}$:

$$I_{cg} \doteq I_{co3}\frac{R_{31}+R_{32}}{\frac{R_{31}}{b_3+1}+R_{32}} \quad (23)$$

assuming that $r_{e2}$ and $r_{b2}$ may be neglected. If $R_{32}$ is chosen large with respect to $R_{31}/(b_3+1)$, then the current generator is also made independent of changes in $b_3$ of the current generating transistor:

$$I_{cg} \doteq I_{co3}\frac{R_{31}+R_{32}}{R_{32}} \quad (24)$$

Using the indicated values for $R_{31}$ and $R_{32}$, the current generator then furnishes approximately twice the saturation current of the currrent generating transistor.

It is important that the temperature function of the current generator correspond closely to that of the first transistor amplifier stage. In general, the transistors employed should have a large collector resistance ($r_c$) and a low leakage current. In most cases this latter requirement is readily attained. When this is true, the collector saturation current ($I_{co}$) of a transistor may be represented as:

$$I_{co}=Ke^{at} \quad (25)$$

where K and *a* are treated as constants. When $r_c$ is low and leakage currents are appreciable, these "constants" are somewhat temperature dependent. In the present arrangement, the effect of collector saturation in the second stage is much less than in the first; hence, the selection of a compensating current generator is made to correspond more closely to the temperature function of the first transistor. Fortunately correspondence of the two functions is not hard to achieve, since adjustment of the tapped resistance 19 brings the value of K into correspondence. K varies fairly widely in samples tested from 0.20 to 1.00 microampere, most values lying between 0.5 and 0.8. The values of "*a*" in the samples tested range from 0.065 to 0.085 per degree centigrade with most occurring in the latter half of this range.

For most precise compensation accordingly, it is desirable to match the "*a*" characteristic of the compensating transistor to that of the first transistor. Since "*a*" is relatively constant with the material used, reproduceability of this factor is fairly easy.

In practice, the compensation adjustment may be made in the following manner. The current gain A of the amplifier and the $I_{co1}$, of the first transistor are determined. Then the tap on $R_{19}$ is adjusted to give an increase in output current $\Delta I_o$ when the compensating transistor is inserted, equal to $AI_{co1}$. This method gives a compensation of 10 to 1 on the average. If the temperature is elevated to the highest ambient temperature expected, and $R_{19}$ readjusted, two to four times better correction is achieved.

FIGURE 5 shows an arrangement wherein somewhat higher output capabilities as well as somewhat greater amplification are achieved by paralleling output stages. In particular, the transistor 11 is parallel by transistor 34 in a circuit which is in other respects like that of FIGURE 1. The net effect of the parallel connection is to reduce the self-heating effect at high signal levels.

The amplifiers illustrated in the figures are characterized by an amplification of approximately 100, with an input current sensitivity which in certain cases has been as low as 0.010 microampere, when operated in the ambient temperature range of from 0 to 50° C. using germanium transistors. A drift of 0.05% full scale per 24 hour period at 25° C., and a linearity of amplification of 0.2% was achieved. If higher temperature operation or higher current sensitivity is desired, silicon type transistor would be preferable. Silicon transistors now available appear to be suited for operation up to 100° C., and within the 0° C. to 50° C. range, would appear to produce less than one tenth the drift of germanium transistors.

Accordingly, it may be noted that applicant's techniques greatly improve the area in which transistors may be operated permitting their use in the very critical field of direct current amplification. Applicant's invention improves the operation of all transistors in such an application, whether the transistors be of germanium, or silicon, or other compositions. While transistors of one conductivity type have been illustrated, transistors of the opposite conductivity type may also be used. For instance, NPN transistors may be substituted for the PNP transistors illustrated upon reversing the polarity of the indicated bias sources.

While particular embodiments of the invention have been shown and described, it should be understood that the invention is not limited thereto, and it is intended in the appended claims to claim all variations as fall in the true spirit of the present invention.

What is claimed is:

1. A temperature stabilized transistor amplifier comprising: a first transistor of a given conductivity type having a base, an emitter and a collector electrode; a first resistor having first and second terminals and a tap intermediate said first and second terminals, said first terminal being connected to said base electrode and said second terminal being connected to said collector electrode; a common terminal; a high impedance signal source connected between said base electrode and said common terminal; means for coupling said emitter electrode to said common terminal; a first direct-current potential source having a first and second terminal means for connecting said first terminal of said first direct current potential source to said common terminal; impedance means for connecting a second terminal of said first direct-current potential source to said collector, said second terminal of said first direct-current potential source having a given polarity with respect to said first terminal of said first direct-current source; means for connecting an output circuit between said collector electrode and said common terminal; a temperature compensating means for generating a temperature-dependent current the magnitude of which varies as an exponential function of ambient temperature, said exponential function being of the same polarity and approximately equal to an exponential function of ambient temperature by which collector current varies in said first transistor due to changes in ambient temperature; and means for directly connecting said temperature compensating current source means to said intermediate tap to compensate the operating point of said transistor against changes in collector saturation current due to ambient temperature changes.

2. A temperature stabilized transistor amplifier as defined in claim 1 wherein said temperature compensating means comprises: a second transistor of said given conductivity type having a base, an emitter and a collector electrode, said collector electrode of said second transistor being directly connected to said intermediate tap; a second direct-current potential source having two terminals; a first impedance means for coupling the base electrode of said second transistor to a first terminal of said second direct-current potential source, said first terminal of said second direct-current potential source being of a polarity opposite the polarity of said second terminal of said first direct-current potential source; means for connecting a second terminal of said second direct-current potential source to said common terminal; and a second impedance means for coupling said emitter electrode of said second transistor to said first terminal of said second direct-current potential source; said first and second impedance means each having a large resistance relative to the emitter resistance and base resistance, respectively, for minimizing the effect of temperature upon the resistive parameters of said second transistor.

3. A temperature stabilized transistor amplifier as defined in claim 1 wherein said temperature compensating means comprises: a second transistor having a base, an emitter and a collector electrode, said collector electrode being directly connected with said intermediate tap; a second and a third resistor serially conducted between said base electrode and said emitter electrode of said second transistor; means for connecting a junction between said second and third resistors to a first terminal of a second direct-current potential source, said first terminal of said second direct-current potential source having a polarity opposite said second terminal of said first direct-current potential source; and a means for connecting a second terminal of said second direct-current potential source to said common terminal.

4. In a temperature stabilized direct current transistor amplifier the combination of: first and second transistor amplifier stages connected in cascade, each stage including a transistor of a given conductvity type having base, emitter, and collector electrodes connected in a common emitter configuration, the collector electrode of the transistor of said first stage being directly connected to the base electrode of the transistor of said second stage; a first resistor coupled between the emitter electrode of said second transistor and a source of reference potential for stabilizing the input impedance of said second stage and the operating point thereof, said first resistor having a resistance value which is small relative to $r_c/(b_2+1)$, wherein $r_c$ and $b_2$ are the collector resistance and current gain, respectively of said transistor and said second stage; a second resistor coupled between the base and collector electrodes of the transistor of said first stage having a resistance value which is small relative to the collector resistance, large relative to the base resistance, and large relative to the product of the emitter resistance and the base input current gain of the transistor of said first stage; a source of biasing potential of a given polarity with respect to said reference potential coupled to the collector of the transistor of said first stage by a means having a high impedance relative to the output impedance of said first stage; means for coupling a load between the collector and said transistor of said second stage and said source of biasing potential, said load having a resistance value which is small relative to $r_c/(b_2+1)$; a temperature compensating means for generating a temperature dependent current the magnitude of which varies as an exponential function of temperature for compensating the operating point of said transistor in said first stage against changes in collector saturation current, said temperature compensating means comprising a single transistor circuit having a collector saturation current which is an exponential function of temperature, the exponential coefficient of said function being approximately equal to and of the same polarity as an exponential coefficient of a current-temperature function of said first stage, said transistor circuit including means for minimizing effects of ambient temperatures upon the circuit parameters thereof and means for directly connecting the collector of said single transistor circuit to an intermediate point on said second resistor.

5. In a temperature stabilized transistor amplifier, a common-emitter amplifier stage comprising: a first transistor having base, emitter, and collector electrodes, said electrodes being biased in a common-emitter configuration; a resistor connected between said collector and base electrodes, said resistor having an intermediate tap; and a current source connected to said intermediate tap, said current source producing a temperature dependent current which varies as an exponential function of the ambient temperature of said transistor, for compensating the operating point of said first transistor against changes in collector saturatioin current, said temperature dependent current being of the same polarity as variations in collector saturation current of said first transistor, whereby variations in collector saturation current due to changes in ambient temperature are compensated by said temperature dependent current source.

6. In a temperature stabilized transistor amplifier, a common-emitter amplifier stage as defined in claim 5 wherein said current source comprises: a second transistor of the same conductivity type as said first transistor, said second transistor having base, emitter and collector electrodes; means connected to said base and emitter electrodes of said second transistor for biasing said second transistor in a non-conducting direction; and direct-current coupling means for coupling said collector electrode of said second transistor to said intermediate tap.

7. In a temperature stabilized direct-current transistor amplifier, the combination which comprises: first and second transistor amplifier stages connected in cascade, each stage including a transistor having base, emitter, and collector electrodes connected in the common-emitter configuration, the collector electrode of the transistor of said first stage being directly connected to the base electrode of the transistor of said second stage; a first resistor coupling the emitter electrode of said second transistor to a common source of reference potential for stabilizing the input impedance of said second stage and the operating point thereof; a second resistor coupled between the base and collector electrodes of the transistor of said first stage, said resistor having a resistance value which is low relative to the collector resistance, large relative to the base resistance, and large relative to the product of the emitter resistance and the base input current gain of the transistor of said first stage; a source of biasing potential in a circuit having a high impedance relative to the output impedance of said first stage coupled between the collector of the transistor of said first stage and said common source of reference potential; and a temperature dependent current source for generating a current the magnitude of which varies as an exponential function of temperature for compensating the operating point of said first transistor against changes in collector saturation current, said temperature dependent current source being connected to an intermediate point on said second resistor, said temperature dependent current source comprising a transistor biased non-conductive the collector saturation current of which is an exponential function of temperature that has the same polarity and approximates in magnitude the exponential function of temperature by which collector saturation current in said first transistor varies.

References Cited in the file of this patent

UNITED STATES PATENTS

| | | |
|---|---|---|
| 2,647,958 | Barney | Aug. 4, 1953 |
| 2,750,456 | Waldhauer | June 12, 1956 |
| 2,806,964 | Spades | Sept. 17, 1957 |
| 2,863,955 | Keonjian | Dec. 9, 1958 |
| 2,928,049 | MacSorley | Mar. 8, 1960 |

OTHER REFERENCES

Shea: "Principles of Transistor Circuits," September 1953, page 164.

UNITED STATES PATENT OFFICE
CERTIFICATION OF CORRECTION

Patent No. 3,009,113 November 14, 1961

James W. Stanton

It is hereby certified that error appears in the above numbered patent requiring correction and that the said Letters Patent should read as corrected below.

Column 5, line 41, for "$r_{c2}/(r_{b2}+1)$" read -- $r_{c2}/(r_{b2}+1)$ --; column 6, line 36, for "(b+i)" read -- $(b_1+1)$ --; column 8, lines 41 to 43, the equation should appear as shown below instead as in the patent:

$$\left(\frac{a}{1-a}\right) \text{ of } b.$$

column 11, line 30, strike out "current source"; line 45, for "of", first occurrence, read -- at --; same column 11, line 61, for "conducted" read -- connected --; column 12, line 52 for "saturatioin" read -- saturation --.

Signed and sealed this 17th day of April 1962.

(SEAL)
Attest:

ESTON G. JOHNSON
Attesting Officer

DAVID L. LADD
Commissioner of Patents